United States Patent
Jin et al.

(10) Patent No.: US 10,692,746 B2
(45) Date of Patent: Jun. 23, 2020

(54) SUBSTRATE LIFT BAR AND METHOD FOR SMEARING ANTI-STATIC LIQUID

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yu Jin, Beijing (CN); Wentong Huang, Beijing (CN); Yuhu Zhang, Beijing (CN); Xiaobo Liu, Beijing (CN); Qi Su, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 191 days.

(21) Appl. No.: 15/801,464

(22) Filed: Nov. 2, 2017

(65) Prior Publication Data
US 2018/0138067 A1    May 17, 2018

(30) Foreign Application Priority Data
Nov. 17, 2016    (CN) .......................... 2016 1 1032498

(51) Int. Cl.
*H01L 21/677* (2006.01)
*H01L 21/687* (2006.01)
*B05C 1/08* (2006.01)

(52) U.S. Cl.
CPC .......... *H01L 21/67742* (2013.01); *B05C 1/08* (2013.01); *B05C 1/0813* (2013.01); *B05C 1/0821* (2013.01); *H01L 21/67751* (2013.01); *H01L 21/68742* (2013.01)

(58) Field of Classification Search
None
See application file for complete search history.

(56) References Cited

U.S. PATENT DOCUMENTS

| | | | | |
|---|---|---|---|---|
| 2,755,768 A | * | 7/1956 | Olson | ..................... B65B 51/02 118/226 |
| 5,260,174 A | * | 11/1993 | Nakazawa | ............... G03F 7/162 118/100 |
| 5,716,489 A | * | 2/1998 | Biagiotti | ................. B05C 1/027 118/243 |
| 5,927,305 A | * | 7/1999 | Shiba | ....................... B08B 3/02 134/153 |

(Continued)

*Primary Examiner* — Binu Thomas
(74) *Attorney, Agent, or Firm* — Brooks Kushman P.C.

(57) ABSTRACT

A substrate lift bar includes: an outer lift bar which is in shape of a box structure and includes one surface having an opening; an inner lift bar which is able to be accommodated in the outer lift bar and includes a supporting surface used for supporting a substrate; an elevator structure for controlling the inner lift bar to move up and down to change from a first state to a second state and back again; and an anti-static liquid smearing structure for smearing an anti-static liquid onto the inner lift bar if the inner lift bar is in the first state. In the first state, the inner lift bar is completely located inside the outer lift bar, and in the second state, the supporting surface of the inner lift bar is substantially flush with the surface having the opening of the outer lift bar.

12 Claims, 3 Drawing Sheets

(56) References Cited

U.S. PATENT DOCUMENTS

| | | | | |
|---|---|---|---|---|
| 6,010,570 A | * | 1/2000 | Motoda | B05C 5/0254 |
| | | | | 118/323 |
| 6,058,544 A | * | 5/2000 | Motoda | B08B 1/007 |
| | | | | 15/77 |
| 2004/0132318 A1 | * | 7/2004 | Kim | B08B 3/02 |
| | | | | 134/1 |

* cited by examiner

SUBSTRATE LIFT BAR AND METHOD FOR SMEARING ANTI-STATIC LIQUID

CROSS-REFERENCE TO RELATED APPLICATION

This application claims priority to Chinese Patent Application No. 201611032498.5 filed on Nov. 17, 2016, which is incorporated herein by reference in its entirety.

TECHNICAL FIELD

The present disclosure relates to the field of liquid crystal product manufacturing technologies, and in particular, to a substrate lift bar and a method for smearing an anti-static liquid.

BACKGROUND

In the technological process of Thin Film Transistor Liquid Crystal Display (TFT-LCD), a mask aligner is mainly utilized to align films on a mask and expose the films onto a gummed glass substrate. The glass substrate is supported by a base. When loading the substrate, a lift bar rises and receives the substrate that is transferred into the mask aligner by a Robot arm and then moves down to the surface of the base to place the substrate on the surface of the base uniformly; when unloading the substrate, the lift bar rises and the substrate thereon is taken away by the Robot arm, then the lift bar is prepared to receive a next substrate.

Electrostatic Discharge (ESD) has always been the intractability of Liquid Crystal Display (LCD) and semiconductor industry. When the substrate is unloaded by the mask aligner, an instantaneous high-voltage static electricity will be generated between the base and the substrate at the moment that the lift bar jacks the substrate up to separate from the surface of the base, which may break down and burn out the films, thus resulting in harmful effects due to the ESD. With the ageing of devices and abrasion of the lift bar, the harmful effects may be increasingly severe. The ESD can be effectively prevented by smearing an anti-static liquid on the surface of the lift bar. A current manner is to manually smear the anti-static liquid on the surface of the lift bar; however, this manner is difficult to smear the anti-static liquid uniformly and thoroughly on the surface of the lift bar, which weakens the anti-static ability and may result in many risks.

SUMMARY

The present disclosure provides a substrate lift bar and a method for smearing an anti-static liquid, which may achieve automatic smearing of the anti-static liquid.

In one aspect, the present disclosure provides a substrate lift bar, including:

an outer lift bar, which is in shape of a box structure and includes one surface having an opening;

an inner lift bar, which is able to be accommodated in the outer lift bar and includes a supporting surface used for supporting a substrate;

an elevator structure, which is used to control the inner lift bar to move up and down to change from a first state to a second state and back again; and an anti-static liquid smearing structure, which is used to smear an anti-static liquid onto the inner lift bar in the case that the inner lift bar is in the first state;

where in the first state, the inner lift bar is completely located inside the outer lift bar; in the second state, the supporting surface of the inner lift bar is substantially flush with the surface having the opening of the outer lift bar.

Optionally, a gap is provided between an edge of the inner lift bar and the outer lift bar.

Optionally, the inner lift bar is provided with multiple through holes for the anti-static liquid to pass through; and the anti-static liquid smearing structure includes: an anti-static liquid supplying structure, which is located at a side of a surface of the outer lift bar opposite to the surface having the opening; and multiple connecting pipes configured to convey the anti-static liquid from the anti-static liquid supplying structure to the supporting surface, where a quantity of the connecting pipes is identical to a quantity of the through holes, each connecting pipe includes one end communicated with the anti-static liquid supplying structure and the other end communicated with a corresponding through hole in the inner lift bar.

Optionally, each connecting pipe may be a bendable elastic hose.

Optionally, substrate lift bar further includes a container and an anti-static liquid recycling structure. The container is arranged at the surface of the outer lift bar opposite to the surface having the opening, the anti-static liquid supplying structure is fixed in the container, and the anti-static liquid recycling structure is fixed in the container and communicated with an interior of the outer lift bar through a pipe.

Optionally, the substrate lift bar further includes a roller, a first clamping groove for fixing the roller is provided at a middle of the outer lift bar, one inner lift bar is provided at each of two sides of the first clamping groove, the two sides being opposite to each other in a length direction of the outer lift bar, and two opposite inside walls of the outer lift bar each extending in the length direction of the outer lift bar are concaved to form a second clamping groove. In the case that the inner lift bar is in the first state, the roller moves to the second clamping groove from the first clamping groove and moves, along the second clamping groove, on the supporting surface of a corresponding inner lift bar.

Optionally, a joint between a first side wall of second clamping groove close to the surface of the outer lift bar opposite to the surface having the opening and the first clamping groove is an arc surface.

Optionally, an opening of the first clamping groove is provided with a cover plate in a detachable manner, and a surface of the cover plate is substantially flush with the surface having the opening of the outer lift bar.

Optionally, the cover plate is provided with a vacuum adsorption plate for adsorbing the substrate.

Optionally, the elevator structure includes an elevator cylinder.

Optionally, the substrate lift bar further includes a programmable logic controller structure for controlling the elevator structure to move and controlling the anti-static liquid smearing structure to smear a preset amount of anti-static liquid.

Optionally, the substrate lift bar further includes a moving structure for controlling the outer lift bar to move to a preset position to bear the substrate.

Optionally, the moving structure includes a linkage bar arranged on the surface of the outer lift bar opposite to the surface having the opening, and a driving shaft for driving the linkage bar to move.

In another aspect, the present disclosure also provides a method for smearing an anti-static liquid, the method is applied to the substrate lift bar mentioned above. The method includes:

controlling, by the elevator structure, the inner lift bar to move down by a preset distance to make the inner lift bar completely inside the outer lift bar; and smearing, by the anti-static liquid smearing structure, the anti-static liquid on the inner lift bar.

Optionally, the step of smearing, by the anti-static liquid smearing structure, the anti-static liquid on the inner lift bar includes:

spraying the anti-static liquid in the anti-static liquid supplying structure on the supporting surface of the inner lift bar via the through holes in the inner lift bar; and moving the roller to the second clamping groove from the first clamping groove and moving the roller, along the second clamping groove, on the supporting surface of a corresponding inner lift bar to make the supporting surface of the corresponding inner lift bar completely coated with the anti-static liquid.

With the technical solutions of the present disclosure, the anti-static liquid is automatically smeared, pollutions on the substrate while smearing the anti-static liquid are prevented, and harms to human body are avoided.

DETAILED DESCRIPTION

Figure 1:
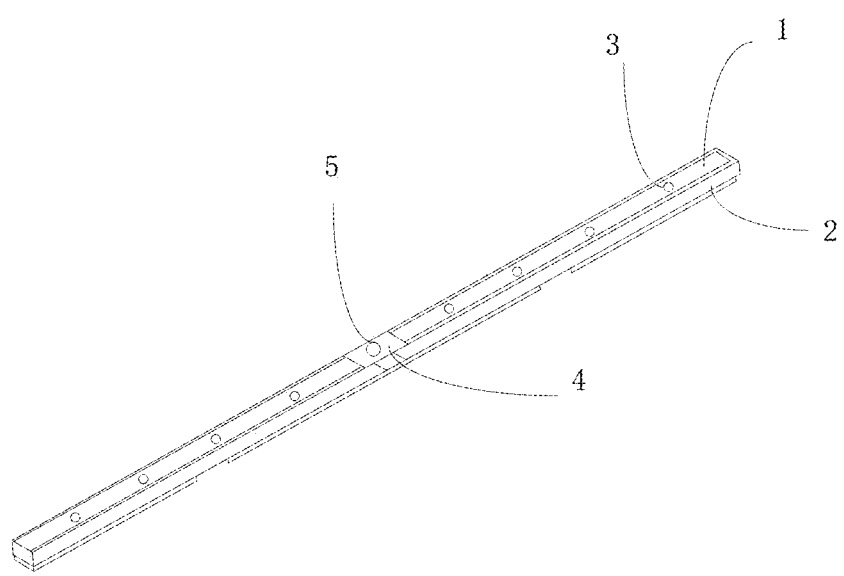
FIG. 1 is a schematic structural diagram of a substrate lift bar according to some embodiments of the present disclosure.

The present disclosure will be described hereinafter in detail in conjunction with the drawings and embodiments. The disclosed embodiments are given for purpose of describing technical solutions of the present disclosure and are not intended to limit the scope of protection of the present disclosure.

As shown in FIG. 1 to FIG. 4, it is provided a substrate lift bar according to some embodiments of the present disclosure, including:

an outer lift bar 2, which is in shape of a box structure and includes one surface having an opening;

an inner lift bar 1, which is able to be accommodated in the outer lift bar 2 and includes a supporting surface used for supporting a substrate;

an elevator structure for controlling the inner lift bar 1 to move up and down so that the inner lift bar 1 is changed from a first state to a second state and back again; and an anti-static liquid smearing structure for smearing an anti-static liquid onto the inner lift bar 1 in the case that the inner lift bar 1 is in the first state;

where in the first state, the inner lift bar 1 is completely located inside the outer lift bar 2, i.e., the inner lift bar 1 is completely located below the surface having the opening of the outer lift bar 2; and in the second state, the supporting surface of the inner lift bar 1 is substantially flush with the surface having the opening of the outer lift bar 2.

The anti-static liquid is automatically smeared by arranging the anti-static liquid smearing structure, so that the working efficiency is improved; moreover by arranging the inner lift bar 1 and the outer lift bar 2, the anti-static liquid is smeared on the inner lift bar 1 when the inner lift bar 1 is completely located inside the outer lift bar 2, which prevents the anti-static liquid from leaking out to contaminate a base for bearing the substrate (the base is provided with the lift bar) and devices surrounding the base; moreover, compared with manual smearing, harms to a human body are avoided, and the anti-static liquid may not be taken out of the lift bar by human and therefore may not cause pollutions on the substrate or other devices.

A variety of structural forms can be provided for the anti-static liquid smearing structure specifically as long as the anti-static liquid can be automatically smeared on the inner lift bar 1 in the first state. Optionally, the inner lift bar 1 is provided with multiple through holes 3 for the anti-static liquid to pass through; and the anti-static liquid smearing structure includes:

an anti-static liquid supplying structure, which is located at a side of a bottom surface of the outer lift bar 2, the bottom surface of the outer lift bar 2 being a surface opposite to the surface having the opening; and multiple connecting pipes for conveying the anti-static liquid from the anti-static liquid supplying structure to the supporting surface, where the quantity of the connecting pipes is identical to the quantity of the through holes 3, each of the connecting pipes has one end communicated with the anti-static liquid supplying structure and the other end communicated with a corresponding through hole 3 in the inner lift bar 1.

In some embodiments, the through holes 3 are arranged uniformly in the inner lift bar 1, and the quantity of the through holes 3 can be set according to actual requirements.

Optionally, the substrate lift bar includes a container, the container is arranged at the bottom surface of the outer lift bar 2, and the anti-static liquid supplying structure is fixed in the container. The anti-static liquid supplying structure includes an anti-static liquid supplying tank 8, which is used to hold the anti-static liquid. One end of each connecting pipe is communicated with the anti-static liquid supplying tank 8.

In some embodiments of the present disclosure, after the anti-static liquid is smeared, the inner lift bar 1 can move up in the outer lift bar 2 so as to support the substrate; in order to facilitate moving up or down the inner lift bar 1, the connecting pipes are bendable elastic hoses in some embodiments.

When smearing the anti-static liquid, redundant anti-static liquid may flow out. In order to prevent the anti-static liquid from flowing out to cause pollutions, in some embodiments of the present disclosure, a gap is provided between an edge of the inner lift bar 1 and the outer lift bar 2. In this way, the redundant anti-static liquid enters the outer lift bar 2 via the gap. After the anti-static liquid is smeared, the inner lift bar 1 is changed to the second state from the first state, i.e., the supporting surface of the inner lift bar 1 is substantially flush with the surface having the opening of the outer lift bar 2, and no anti-static liquid may flow out.

In the case that the anti-static liquid stays in the outer lift bar 2 for quite a long time or there is too much anti-static liquid accumulated in the outer lift bar 2, in order to prevent the anti-static liquid from flowing out, the substrate lift bar in some embodiments of the present disclosure further includes an anti-static liquid recycling structure 9 that is fixed in the container and communicated with the interior of the outer lift bar 2 through a pipe 7.

The anti-static liquid entering the outer lift bar 2 via the gap between the inner lift bar 1 and the outer lift bar 2 flows into the anti-static liquid recycling structure 9 through the pipe 7, so that the anti-static liquid is recycled, pollutions are prevented and resources are saved.

Figure 2:
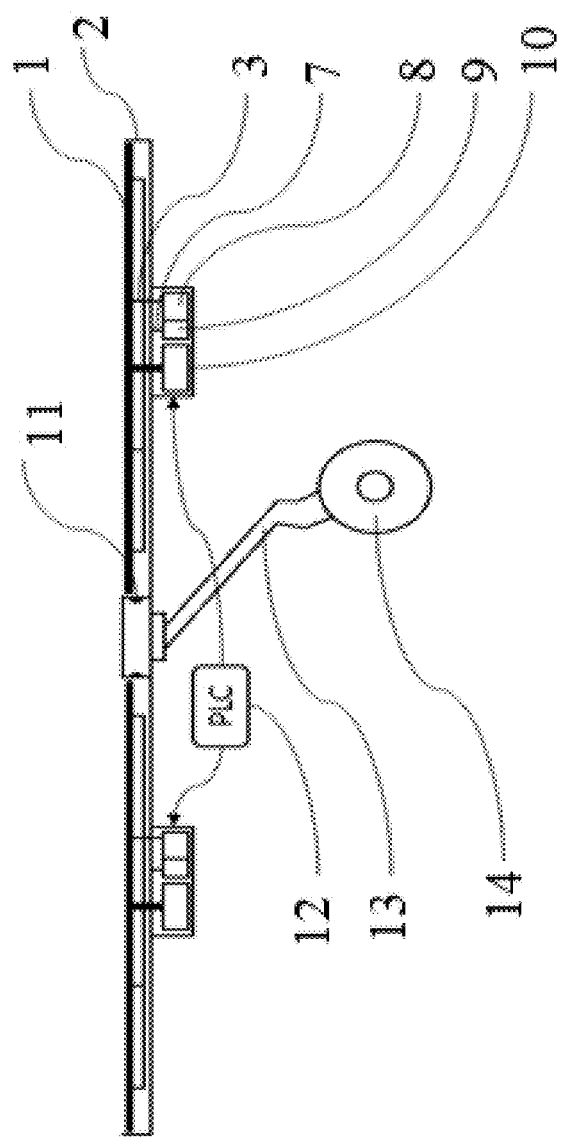
FIG. 2 is a sectional view of a substrate lift bar according to some embodiments of the present disclosure.
Figure 3:
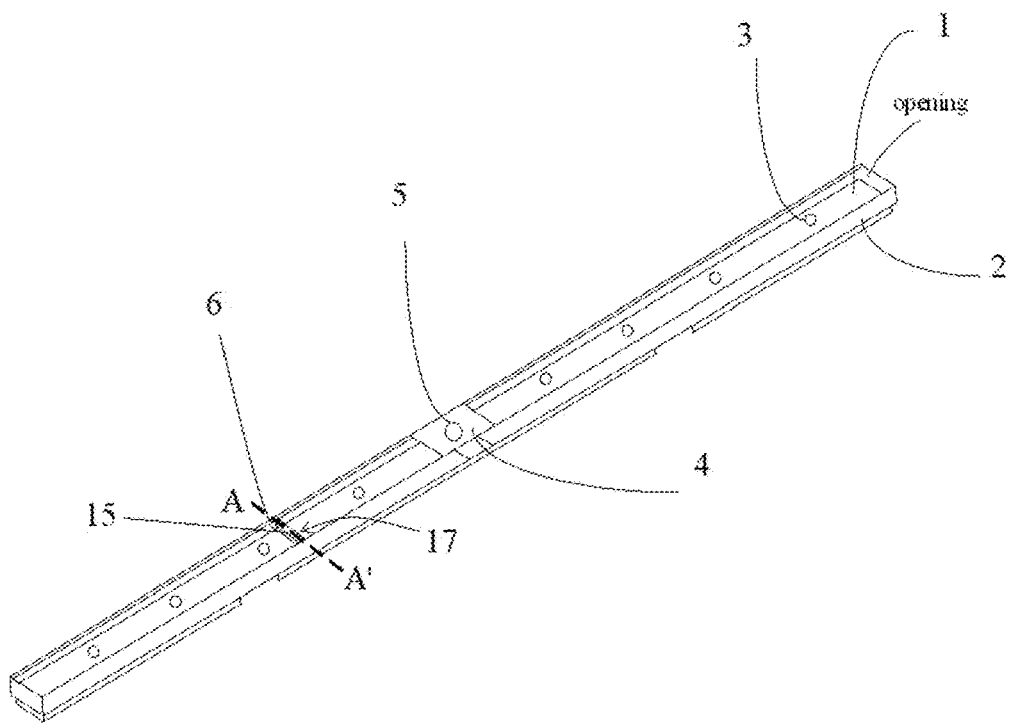
FIG. 3 is a structural schematic diagram when an inner lift bar is in a first state according to some embodiments of the present disclosure.

As shown in FIGS. 2 and 3, the substrate lift bar in some embodiments of the present disclosure further includes a roller 17. A first clamping groove 11 for fixing the roller 17 is provided at a middle portion of the outer lift bar 2. One inner lift bar 1 is provided at each of two sides of the first clamping groove 11, the two sides being opposite to each other in a length direction of the outer lift bar 2. Two opposite inside walls of the outer lift bar 2 each extending in the length direction of the outer lift bar 2 are concaved to form a second clamping groove 6.

In the case that the inner lift bar is in the first state, the roller 17 can move to the second clamping groove 6 from the first clamping groove 11 and can move along the second clamping groove 6 so that the roller 17 can move on the supporting surface of a corresponding inner lift bar 1. The roller 17 may be manually controlled to move, or may be driven by a device to move. In the embodiment, because one inner lift bar 1 is arranged at each of the two opposite sides of the first clamping groove 11, the two opposite sides are respectively provided with corresponding containers, corresponding elevator structures, corresponding anti-static liquid supplying tanks 8, corresponding connecting pipes that connect the anti-static liquid supplying tanks 8 with through holes 3, corresponding anti-static liquid recycling structures 9, corresponding pipes 7 that connect the anti-static liquid recycling structures 9 with the interior of the outer lift bar 2, and corresponding second clamping grooves 6.

Figure 4:
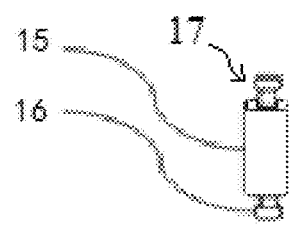
FIG. 4 is a schematic structural diagram of a roller according to some embodiments of the present disclosure.

As shown in FIG. 4, the roller 17 includes a rolling shaft 16 and a smearing portion 15 sleeved on the roller shaft 16.

Figure 5:
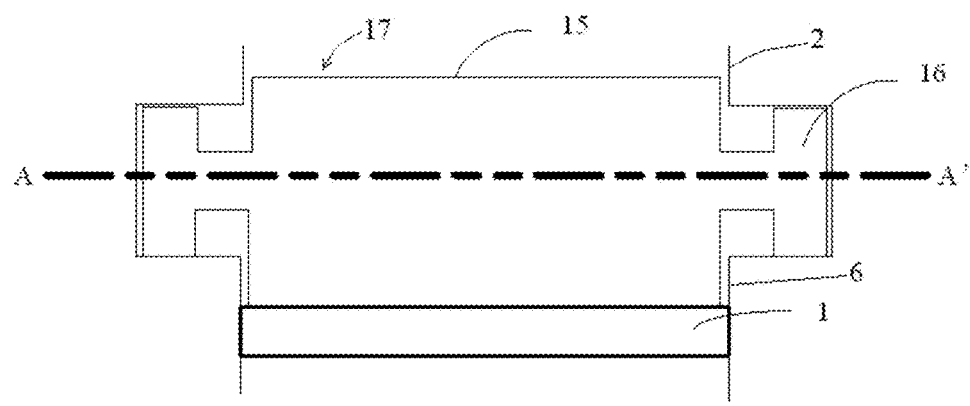
FIG. 5 is a schematic sectional view taken along line A-A' in FIG. 3.

FIG. 3 shows a state that the roller 17 is located in the second clamping groove 6. FIG. 5 is a sectional view taken along line A-A' in FIG. 3; as shown in FIG. 5, the roller 17 is clamped between the two concaved side walls of the outer lift bar 2 forming the second clamping groove. In order to smear the anti-static liquid, the elevator structure controls the inner lift bar 1 to move down, and the anti-static liquid supplying structure automatically sprays the anti-static liquid via the through holes 3 in the inner lift bar 1; the roller 17 moves to the second clamping groove 6 from the first clamping groove 11, and moves back and forth on the supporting surface of the corresponding inner lift bar 1, so that the anti-static liquid is uniformly smeared on the supporting surface of the inner lift bar 1. When the supporting surface of the inner lift bar 1 at one side is coated with the anti-static liquid completely, the roller 17 moves to the second clamping groove 6 on the other side via the first clamping groove 11 and moves back and forth on the supporting surface of the inner lift bar 1 located at the other side along the second clamping groove 6 located at the other side. After the supporting surfaces of the inner lift bars 1 at the two sides are completely coated, the roller 17 enters the first clamping groove 11 for fixation, and redundant anti-static liquid may enter the outer lift bar 2 from the gap between each inner lift bar 1 and the outer lift bar 2, and then enter the anti-static liquid recycling structure for recycling. After several minutes standing (the specific time can be set according to the actual requirements) since the anti-static liquid is uniformly smeared, the inner lift bars 1 at the two sides are changed into the second state from the first state under the control of the corresponding elevator structures, so as to support the substrate.

In order to facilitating moving the roller 17 from the first clamping groove 11 into the second clamping groove 6, in some embodiments, a joint between a first side wall of the second clamping groove 6 close to the bottom surface of the outer lift bar 2 (a surface disposed opposite to the surface having the opening) and the first clamping groove 11 is an arc surface.

The roller 17 may get polluted after being used for quite a long time. In order to prevent the polluted roller 17 from adversely affecting the smearing of the anti-static liquid, it is necessary to clean or replace the roller 17 frequently. To facilitate replacing the roller 17, in some embodiments of the present disclosure, the first clamping groove 11 has an opening and the opening of the first clamping groove is provided with a cover plate 4 in a detachable manner, and a surface of the cover plate 4 is substantially flush with the surface having the opening of the outer lift bar 2. The roller 17 can be taken out by taking down the cover plate 4.

Optionally, the cover plate 4 is provided with a vacuum absorption plate 5 for absorbing the substrate, which helps to absorb and fix the substrate.

Optionally, the elevator structure includes an elevator cylinder 10. The elevator cylinder 10 can be arranged in the container. One end of the elevator cylinder can directly pass through the outer lift bar 2 so as to be connected with the inner lift bar 1 to make the inner lift bar 1 move up and down; or one end of the elevator cylinder may be connected with a connecting bar that passes through the outer lift bar 2 to support the inner lift bar 1, to make the inner lift bar 1 move up and down.

Optionally, the substrate lift bar further includes a programmable logic controller (PLC) structure 12 for controlling the elevator structure to move and controlling the anti-static liquid smearing structure to smear a preset amount of anti-static liquid.

The anti-static liquid supplying structure may be controlled by the PLC structure 12 to uniformly spray a fixed amount of anti-static liquid, time spent in smearing can be effectively shortened, unnecessary waiting and shutting down are avoided, and the anti-static liquid can be saved.

Optionally, the substrate lift bar further includes a moving structure for controlling the outer lift bar 2 to move to a preset position so as to bear the substrate.

Optionally, the moving structure includes a linkage bar 13 that is located outside the outer lift bar 2 and arranged on the bottom surface of the outer lift bar 2, and a driving shaft 14 for driving the linkage bar 13 to move.

Some embodiments of the present disclosure provide a method for smearing an anti-static liquid, the method is applied to the substrate lift bar mentioned above and includes the following steps:

controlling, by the elevator structure, the inner lift bar to move down by a preset distance to make the inner lift bar completely inside the outer lift bar; and smearing, by the anti-static liquid smearing structure, the anti-static liquid on the inner lift bar.

The preset distance can be set according to actual requirements as long as the inner lift bar can be completely located inside the outer lift bar so as to smear the anti-static liquid on the inner lift bar. In some embodiments of the present disclosure, the preset distance may be 1 cm; in the present disclosure, the preset distance is not limited to 1 cm.

In some embodiments of the present disclosure, the elevator structure is controlled by a PLC structure, so as to automatically control the inner lift bar to move up and down.

After a preset time of standing since the smearing of the anti-static liquid is finished, the inner lift bar moves up to a position that the supporting surface of the inner lift bar is substantially flush with the surface having the opening of the outer lift bar, and the substrate can be lifted by the substrate lift bar.

Further, the step of smearing, by the anti-static liquid smearing structure, the anti-static liquid on the inner lift bar specifically includes:

spraying the anti-static liquid in the anti-static liquid supplying structure onto the supporting surface of the inner lift bar via the through holes in the inner lift bar; and moving the roller 17 to a second clamping groove from a first clamping groove and moving the roller 17, along the second clamping groove, on the supporting surface of a corresponding inner lift bar to make the supporting surface of the corresponding inner lift bar completely coated with the anti-static liquid.

To be specific, under the control of the PLC structure, the anti-static liquid supplying structure automatically sprays the anti-static liquid onto the supporting surface of the inner lift bar via the through holes in the inner lift bar. The roller 17 moves back and forth on the supporting surface of the inner lift bar so that the supporting surface is completely covered by the anti-static liquid.

Those described above are preferred embodiments of the present disclosure. It should be noted that, those having ordinary skills in the art can make various improvements and modifications without departing from the principle of the disclosure, and those improvements and modifications all fall in the scope of protection of the present disclosure.

What is claimed is:

1. A substrate lift bar, comprising:
an outer lift bar, which is in shape of a box structure and comprises one surface having an opening;
an inner lift bar, which is able to be accommodated in the outer lift bar and comprises a supporting surface used for supporting a substrate;
an elevator structure, which is configured to control the inner lift bar to move up and down to change from a first state to a second state and back again; and
an anti-static liquid smearing structure, wherein when the inner lift bar is in the first state, the anti-static liquid smearing structure is configured to smear an anti-static liquid onto the inner lift bar;
wherein in the first state, the inner lift bar is completely located inside the outer lift bar; in the second state, the supporting surface of the inner lift bar is substantially flush with the surface having the opening of the outer lift bar;
wherein the inner lift bar is provided with a plurality of through holes for the anti-static liquid to pass through; and
wherein the anti-static liquid smearing structure comprises:
an anti-static liquid supplying structure, which is located at a side of a surface of the outer lift bar opposite to the surface having the opening; and
a plurality of connecting pipes configured to convey the anti-static liquid from the anti-static liquid supplying structure to the supporting surface, wherein a quantity of the connecting pipes is identical to a quantity of the through holes, each connecting pipe comprises one end in communication with the anti-static liquid supplying structure and the other end communication with a corresponding through hole in the inner lift bar.

2. The substrate lift bar according to claim 1, wherein a gap is provided between an edge of the inner lift bar and the outer lift bar.

3. The substrate lift bar according to claim 1, wherein each connecting pipe is a bendable elastic hose.

4. The substrate lift bar according to claim 1, further comprising a container and an anti-static liquid recycling structure, wherein the container is arranged at the surface of the outer lift bar opposite to the surface having the opening, the anti-static liquid supplying structure is fixed in the container, and the anti-static liquid recycling structure is fixed in the container and communicated with an interior of the outer lift bar through a pipe.

5. The substrate lift bar according to claim 1, further comprising a roller, wherein a first clamping groove for fixing the roller is provided at a middle portion of the outer lift bar, the inner lift bar comprises a pair of inner lift bars that are each provided at one of two sides of the first clamping groove, the two sides being opposite to each other in a length direction of the outer lift bar, and two opposite inside walls of the outer lift bar each extending in the length direction of the outer lift bar are concaved to form a second clamping groove; and
when the inner lift bar is in the first state, the roller is movable to the second clamping groove from the first clamping groove and is movable, along the second clamping groove, on the supporting surface of a corresponding inner lift bar.

6. The substrate lift bar according to claim 5, wherein a joint between a first side wall of the second clamping groove adjacent to a surface of the outer lift bar opposite to the surface having the opening and the first clamping groove is an arc surface.

7. The substrate lift bar according to claim 5, wherein an opening of the first clamping groove is provided with a cover plate in a detachable manner and a surface of the cover plate is substantially flush with the surface having the opening of the outer lift bar.

8. The substrate lift bar according to claim 7, wherein the cover plate is provided with a vacuum adsorption plate for adsorbing the substrate.

9. The substrate lift bar according to claim 1, wherein the elevator structure comprises an elevator cylinder.

10. The substrate lift bar according to claim 1, further comprising a programmable logic controller structure, which is configured to control the elevator structure to move and to control the anti-static liquid smearing structure to smear a preset amount of anti-static liquid.

11. The substrate lift bar according to claim 1, further comprising a moving structure configured to control the outer lift bar to move to a preset position to bear the substrate.

12. The substrate lift bar according to claim 11, wherein the moving structure comprises a linkage bar arranged on a surface of the outer lift bar opposite to the surface having the opening, and a driving shaft configured to drive the linkage bar to move.

* * * * *